(12) United States Patent
Yamanoi

(10) Patent No.: US 6,615,294 B1
(45) Date of Patent: *Sep. 2, 2003

(54) RECORDING/REPRODUCING APPARATUS USING AN IC MEMORY

(75) Inventor: Kiyotaka Yamanoi, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/182,792

(22) Filed: Oct. 30, 1998

(30) Foreign Application Priority Data

Nov. 5, 1997 (JP) .......................................... P09-302372

(51) Int. Cl.$^7$ .............................. G06F 3/06; G11B 7/00; G11B 20/10; G11B 5/09; H04M 11/10
(52) U.S. Cl. .......................... 710/52; 710/53; 710/56; 704/201; 369/25.01; 369/30.01; 369/47.1; 340/7.52; 379/67.1; 379/68; 386/46; 455/412
(58) Field of Search .............................. 710/52, 53, 56, 710/57; 704/200, 201, 278; 369/25, 47, 25.01, 30.01, 47.1; 379/67, 68, 67.1; 340/7.52; 386/46; 455/412

(56) References Cited

U.S. PATENT DOCUMENTS

| 4,873,520 A | * | 10/1989 | Fisch et al. ................. 340/7.57 |
| 4,949,085 A | * | 8/1990 | Fisch et al. ................. 340/7.52 |
| 5,025,252 A | * | 6/1991 | DeLuca et al. ............. 340/7.41 |
| 5,258,751 A | * | 11/1993 | DeLuca et al. ............. 340/7.52 |
| 5,418,762 A | * | 5/1995 | Kitayama ..................... 369/13 |
| 5,483,577 A | * | 1/1996 | Gulick ........................... 379/67 |
| 5,519,684 A | * | 5/1996 | Iizuka et al. .................. 369/93 |
| 5,519,765 A | * | 5/1996 | Sonoda et al. ................ 379/67 |
| 5,630,132 A | * | 5/1997 | Allran et al. ................ 395/670 |
| 5,664,060 A | * | 9/1997 | Jarrett et al. ................ 704/270 |
| 5,687,150 A | * | 11/1997 | Nonaka et al. ............... 369/60 |
| 5,687,216 A | * | 11/1997 | Svensson ..................... 455/412 |
| 5,721,537 A | * | 2/1998 | Protas .................... 340/825.44 |
| 5,724,322 A | * | 3/1998 | Kondo et al. ................. 369/32 |
| 5,774,863 A | * | 6/1998 | Okano et al. ............... 704/278 |
| 5,898,759 A | * | 4/1999 | Huang ........................ 379/67.1 |
| 5,923,900 A | * | 7/1999 | Soell et al. ................. 395/860 |
| 5,974,483 A | * | 10/1999 | Ray et al. ..................... 710/52 |
| 6,038,199 A | * | 3/2000 | Pawlowski et al. ........... 369/25 |
| 6,064,792 A | * | 5/2000 | Fox et al. ..................... 386/46 |
| 6,205,419 B1 | * | 3/2001 | Fiedler ........................ 704/201 |

OTHER PUBLICATIONS

Digital note recorder Notecorder 300 copy of product package and instructions attached. Olympus America Inc., Melville, NY marketed 1996.*

Automobile Radio with Digital Recording "Panasonic CQ–DP745" Matsushita Consumer Electronics Co., Secaucus, NJ 1996 Catalog.*

* cited by examiner

*Primary Examiner*—Jeffrey Gaffin
*Assistant Examiner*—Tanh Nguyen
(74) *Attorney, Agent, or Firm*—Jay B. Maioli

(57) ABSTRACT

A recording/reproducing apparatus using an IC memory includes an IC memory to/from which writing/reading of an audio signal is performed; and a control circuit for controlling writing/reading of the audio signal to/from this IC memory, and its address, and for controlling, on writing and reading the audio signal to and from the IC memory, so that its address becomes ring-shaped, writing, of when a recording key is pressed, the audio signal from contiguous address to an area, within the IC memory where the writing, which has never been read is performed, and reading, of when a reproduction key is pressed, the audio signal from the head of an area within the IC memory where the writing, which has never been read, is performed.

1 Claim, 8 Drawing Sheets

| AREA | HEAD ADDRESS | HEAD FLAG | UNREPRODUCED FLAG |
|------|--------------|-----------|-------------------|
| $X_{A1}$ | $A_{ADR1}$ | BGN1 | UPB1 |
| $X_{A2}$ | $A_{ADR2}$ | BGN2 | UPB2 |
| $X_{A3}$ | $A_{ADR3}$ | BGN3 | UPB3 |
| . | . | | |
| . | . | | |
| . | . | | |
| $X_{An}$ | $A_{ADRn}$ | BGNn | UPBn |

RECT

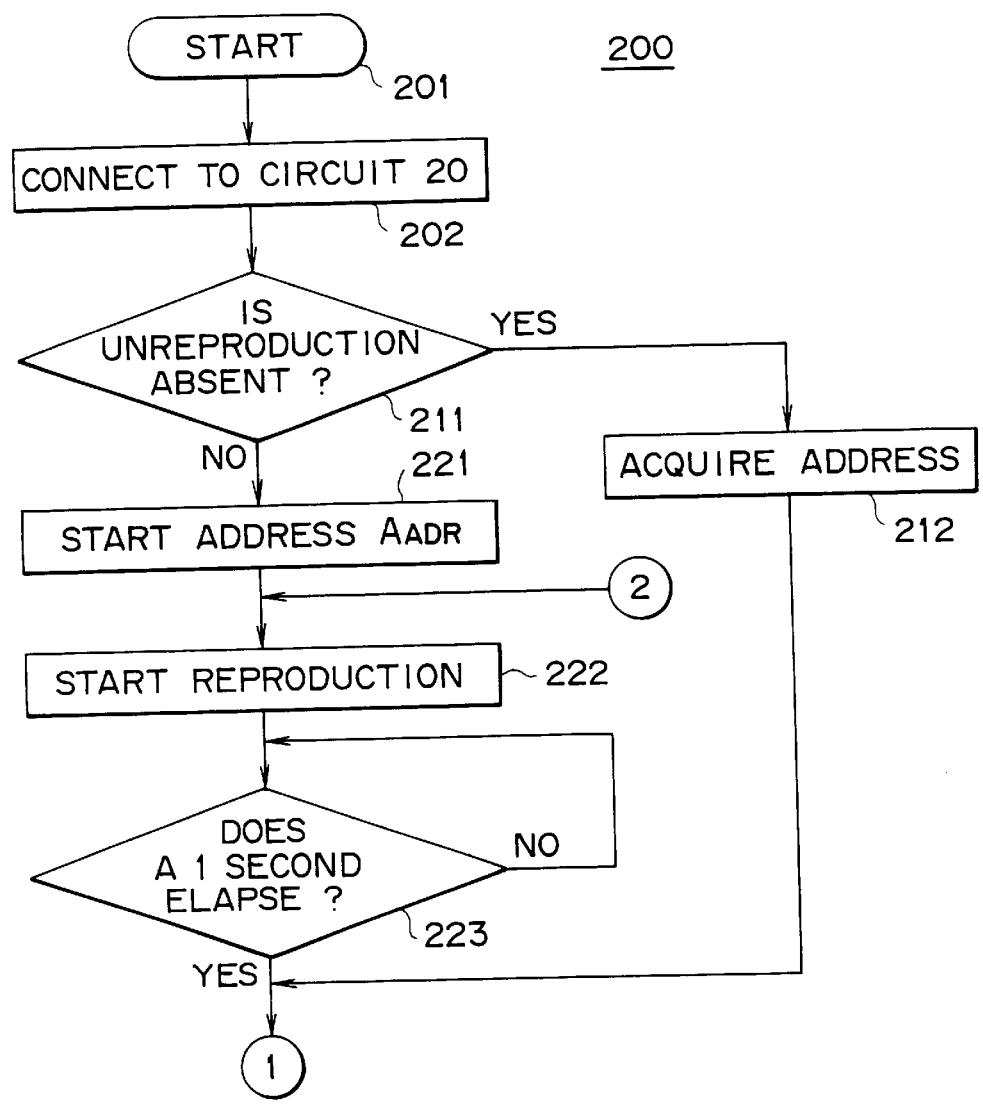

| FIG.4A | FIG.4B |

F I G. 5

| AREA | HEAD ADDRESS | HEAD FLAG | UNREPRODUCED FLAG |
|------|--------------|-----------|-------------------|
| $X_{A1}$ | AADR1 | BGN1 | UPB1 |
| $X_{A2}$ | AADR2 | BGN2 | UPB2 |
| $X_{A3}$ | AADR3 | BGN3 | UPB3 |
| ⋮ | ⋮ | | |
| $X_{An}$ | AADRn | BGNn | UPBn |

RECT

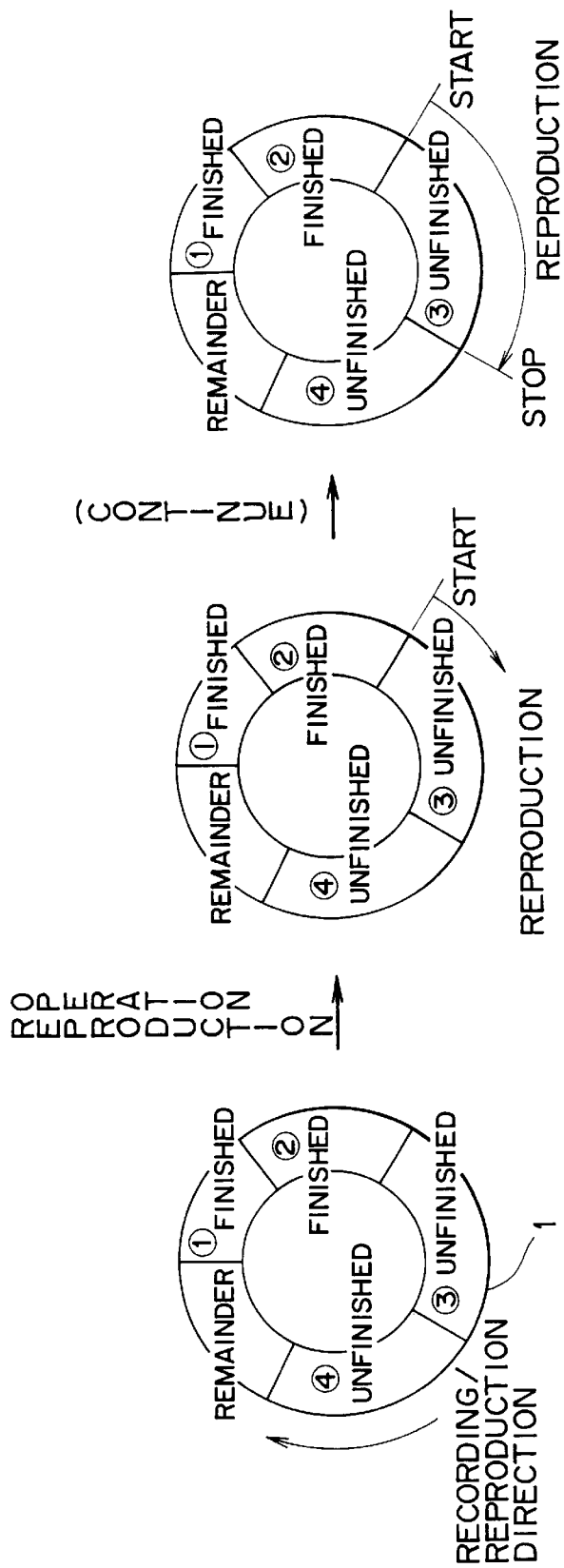

RECORDING/REPRODUCING APPARATUS USING AN IC MEMORY

BACKGROUND OF THE INVENTION

1. Field of the Invention

The present invention relates to an IC recording/reproducing apparatus.

2. Description of Related Art

There is an IC in which a memory is used as a recording medium for audio signals, and the memory, a recording circuit and a reproducing circuit are incorporated into one chip. Such an IC cannot carry out recording for a long time unlike a tape recorder, but can carry out recording for several minutes. This is therefore suitable for simply recording such a brief message as a memo, i.e., a matter of business or the like.

If a memory, is used the recording medium records and reproduces signals in address order in the structure of the address management.

For this reason, it is necessary to manage records by assigning a number to each of matters of business recorded among others and to erase any unnecessary matters of business in accordance with this management information, and therefore, the operations become complicated. Also, even if there are some matters which may be erased, the recording time will not belong unless they are erased in advance.

SUMMARY OF THE INVENTION

The present invention intends to solve these problems. For this reason, the present invention provides an IC recording/reproducing apparatus, comprising:

a memory to/from which writing/reading of an audio signal is performed; and a control circuit for controlling writing/reading of the audio signal to/from this memory, and its address, the control circuit controlling, so that on writing and reading the audio signal to and from the memory, its address becomes ring-shaped, writing, of when a recording key is pressed, the audio signal from an address contiguous to an area within the memory where the writing, which has never been read, is performed, and reading, of when a reproduction key is pressed, the audio signal from the head of an area within the memory where the writing, which has never been read, is performed.

Therefore, on recording, no overwriting is performed on any matters which have not yet been reproduced, but a new matter is overwritten on matters which have been reproduced even once. Also, on reproducing, a matter which has not yet been reproduced is preferentially reproduced.

BRIEF DESCRIPTION OF THE DRAWINGS

FIG. 3 is a flowchart showing a part of an embodiment according to the present invention;

FIG. 5 is a view showing an embodiment of a data table;

FIG. 6 is a schematic view for explaining the present invention; and

DETAILED DESCRIPTION OF PREFERRED EMBODIMENTS

Figure 1:
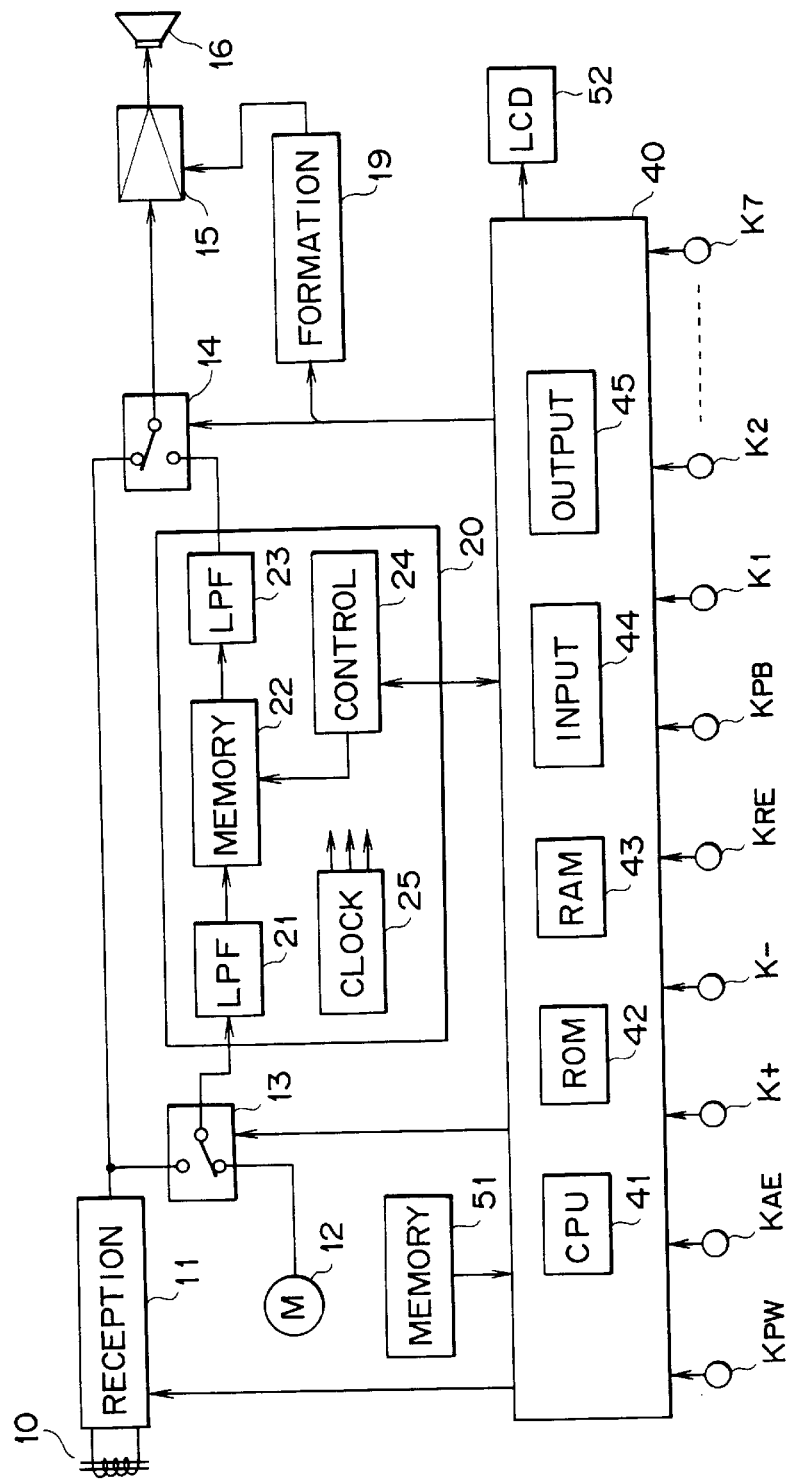
FIG. 1 is a system circuit block diagram showing an embodiment according to the present invention.

To record a matter generally presupposes a condition that it will be reproduced later. Namely, a matter which has been once recorded will be heard at least once.

In the present invention, assuming as follows:

An unreproduced matter: a matter which has not yet been reproduced although recorded, and A reproduced matter: a matter which has been reproduced at least once after recorded. The unreproduced matter is distinguished from the reproduced matter. On recording a new matter in the memory, overwrite recording is allowed for the reproduced matter, but is prohibited for the unreproduced matter.

Also, in order to efficiently use a recording area for a unreproduced matter and a recording area for a reproduced matter on the memory, the address of the memory is made into a ring-shape.

In other words, in FIGS. 6 and 7, reference numeral 1 schematically designates addresses and the recording messages (matters) of a memory for recording and reproducing a matter, and the addresses are made ring-shaped as described above. In the ring-shaped addresses, the addresses shall be used in a clockwise direction on recording and reproducing.

It is assumed as shown in FIG. 6A that four matters ①, ②, ③ and ④ are recorded in this order in the memory 1 and the matters ① and ② are reproduced matters (these are indicated by "finished") while the matters ③ and ④ are unreproduced matters (these are indicated by "unfinished"). In this respect, the remaining area may be either a non-recorded area or a reproduced area.

In a case where the matters of the memory 1 are in such a state, when the reproduction key is pressed, the oldest unreproduced one of the unreproduced matters at this point of time, i.e., the matter ③ is started from its head for reproducing as shown in FIG. 6B. After the matter ③ is reproduced as shown in FIG. 6C, the reproducing is terminated then, and a stop state is reached. Accordingly, at this point of time, the matter ③ becomes a reproduced one.

When the reproduction key is pressed again in the state shown in FIG. 6C, the matter ④, which is the oldest unreproduced one of the unreproduced matters at this point of time, is reproduced from its head.

If there are thus any unreproduced matters, the oldest unreproduced matter of those will be reproduced from its head, and after the matter is reproduced, the reproducing will be automatically stopped.

Figure 7A:
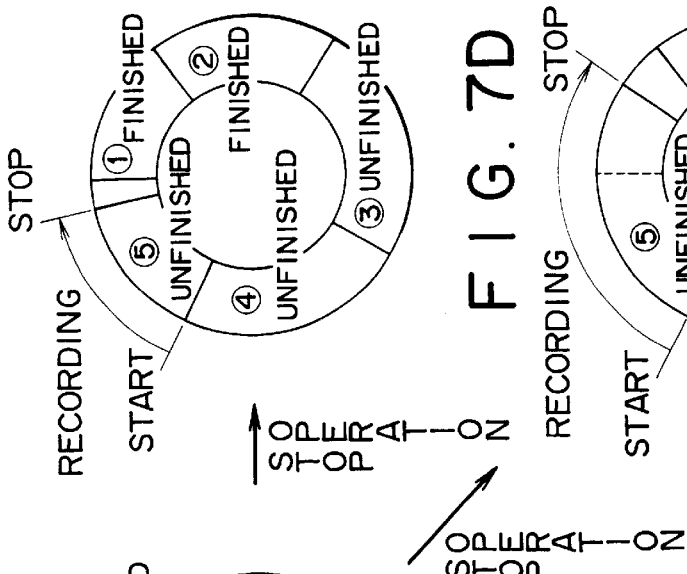
FIG. 7 is a schematic view for explaining the present invention.
Figure 7B:
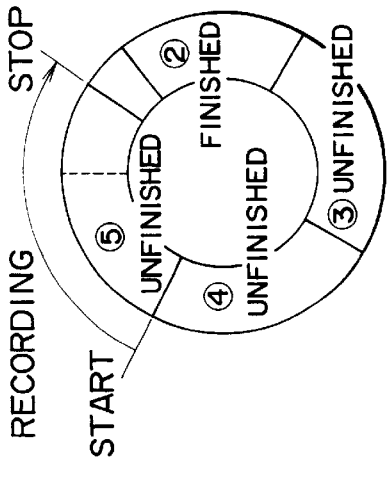

On the other hand, when the recording key is pressed with the matters in the memory 1 in such a state as shown in FIG. 7A (this is the same as FIG. 6A), the newest unreproduced one of the unreproduced matters at this point of time as shown in FIG. 7B is the matter ④, and the recording starts from the next address thereto.

Figure 7C:
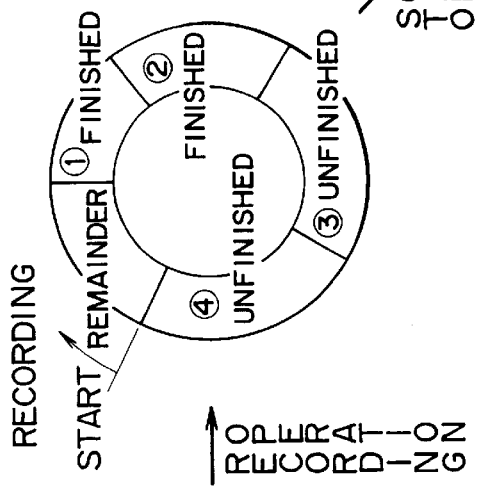

When the stop key for recording is pressed before the recording reaches the area ① as shown in FIG. 7C, the recording is stopped there. Therefore, at this time, the area contiguous to the matter ④ becomes a new unreproduced matter ⑤, and at the same time, includes a newer matter recorded than the matter ④.

Figure 7D:
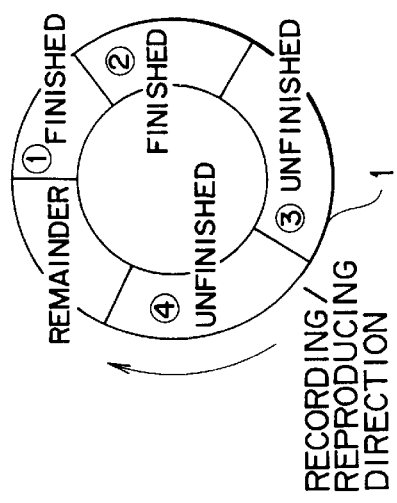

When the stop key for recording is not pressed even if the recording reaches immediately before the area in which the matter ① has been recorded, the recording is continued by overwriting to the area for the matter ① as shown in FIG. 7D. When the stop key for recording is pressed during the recording, the recording is stopped there. Therefore, an unreproduced matter ⑤ is to be recorded to extend over between the next one to the matter ④ and the previous matter ①.

Further, when the stop key for recording is not pressed even if the recording is performed on the entire area for the matter ①, the recording is continued by overwriting also to the area for the matter ②. When the stop key for recording is pressed while the recording is being performed on the area for this matter ②, this is the same as in FIG. 7D, and the recording is stopped there and the recording becomes a new matter ⑤.

When the stop key for recording is not pressed even if the recording reaches the last of the area for the matter ②, the next recording area is the area for the unreproduced matter ③, and therefore, the recording is automatically stopped in front of the area for the matter ③.

In this respect, since recording and reproducing are performed as described above, the description on recording or reproducing from the state of FIG. 6A or FIG. 7A shows all cases even if the state of FIG. 7A is different from that of FIG. 6A in numbers of unreproduced matters and reproduced matters.

In the present invention, recording and reproducing are performed in accordance with the above-described procedures or rules.

Hereinafter, the description will be made of an embodiment when the present invention is applied to an IC recording/reproducing circuit incorporated in an AM receiver.

FIG. 1 is a block diagram showing an IC recording/reproducing circuit incorporated in an AM receiver, and a reception circuit 11 for receiving AM broadcasting connected to a bar antenna 10 includes the circuits from an antenna input circuit to an AM detection circuit, and is constituted according to the superheterodyne system. Further, this reception circuit 11 is constituted according to the synthesizer system, and oscillation signals from VCO of PLL are used as local oscillation signals. By changing the dividing ratio of a PLL variable dividing circuit, the local oscillation frequency is changed to change the reception frequency.

On receipt of broadcasting, a broadcasting audio signal is taken out from the reception circuit 11, and this audio signal is supplied to a speaker 16 through a switching circuit 14 and an amplifier 15 which are connected as shown in the figure during reception of broadcasting.

Reference numeral 12 designates a built-in microphone, and reference numeral 20 designates a recording/reproducing circuit. In this case, the recording/reproducing circuit 20 comprises an IC incorporated into one chip, and in this example, the recording/reproducing circuit 20 does not convert an audio signal into digital data, but records and reproduces it with the analog signal remaining as it is. For this reason, the recording/reproducing circuit 20 consists of a low-pass filter 21, a memory 22, a low-pass filter 23, a control circuit 24, and a clock forming circuit 25.

The filter 21 performs anti-aliasing process of an audio signal to be recorded. Further, the memory 22 samples audio signals from the filter 21 at a predetermined frequency to store onto each address in order for each sample on writing, and on reading, fetch, from each address, the samples written therein in sequence to output audio signals. The filter 23 performs a smoothing process of an audio signal fetched from the memory 22.

The control circuit 24 controls writing/reading of audio signals to/from the memory 22, and their addresses. When a command RECPWR for instructing to stand ready for writing and an address A ADR are supplied, the control circuit 24 stands ready in a state to start writing at an address A ADR of the memory 22, and when a command RECD for indicating permission for writing is supplied, the control circuit 24 starts the writing at the address A ADR.

When a command PLAYPWR for instructing to stand ready for reading and an address A ADR are supplied, the control circuit 24 stands ready in a state to start reading at the address A ADR of the memory 22, and when a command PLAYDD or indicating permission for reading is supplied, the control circuit 24 starts reading at the address A ADR.

When writing or reading has advanced to the last address to or from the memory 22 on writing and on reading, data OVR indicating this advancement is outputted from the control circuit 24. When on reading, the reading has advanced to the last address where the writing was performed, data EOM indicating this advancement is outputted from the control circuit 24.

When a command STOP for instructing to stop is supplied while writing or reading is being performed to or from the memory 22, the writing or reading is stopped. In this respect, since a start address A ADR for writing to the memory 22 and termination of the writing can be optionally set or controlled as described above, a plurality of matters or messages (audio signals) can be stored in one memory 22.

Further, the control circuit 24 also controls the power supply state for this recording/reproducing circuit 20, i.e., the IC 20, and when a command STOPPWRD is supplied while the IC 20 is in an activated state, the IC 20 is caused to be in a standby state, and stands ready for a next effective command with almost no consumption of electric current. When a command POWERUP is supplied while the IC 20 is the standby state, the IC 20 is caused to be in an activated state, and comes to accept a command RECPWR, PLAYPWR for recording or reproducing (write or read) as described above.

In this respect, as an IC 20 capable of recording and reproducing as described above, there are, for example, ICs of ISD33000 series produced by ISD Corp. One of these ICs has the following specifications: the sampling frequency when audio signals are recorded on the memory 22 is 6.4 kHz, the cut-off frequency of filters 21 and 23 is 2.7 kHz, and the maximum recording time is 150 seconds. In the IC of the same series, the memory 22 is a nonvolatile memory, and it is not necessary to create any backup copies even when the power supply is turned off.

Reference numeral 40 designates a microcomputer for system control, and as this microcomputer, a 4-bit microcomputer μPD17073 produced by NEC Corporation was used. This microcomputer 40 is prepared by incorporating the following into one chip: a CPU 41, a ROM 42 having a program for controlling this receiver written therein; a RAM 43 for a work area; an input port 44 and an output port 45; and the like.

Figure 2:
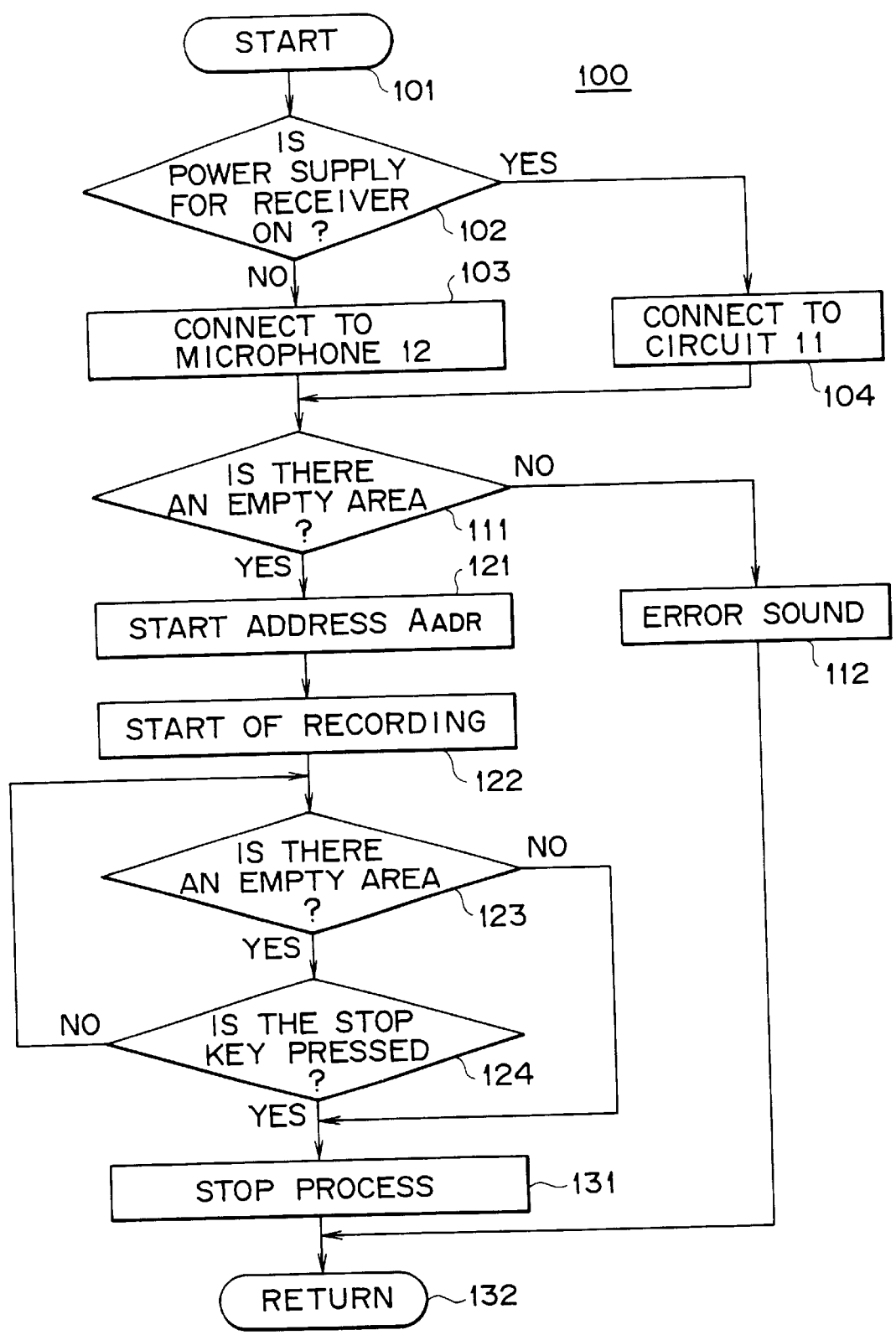
FIG. 2 is a flowchart showing a part of an embodiment according to the present invention.
Figures 4, 4A:
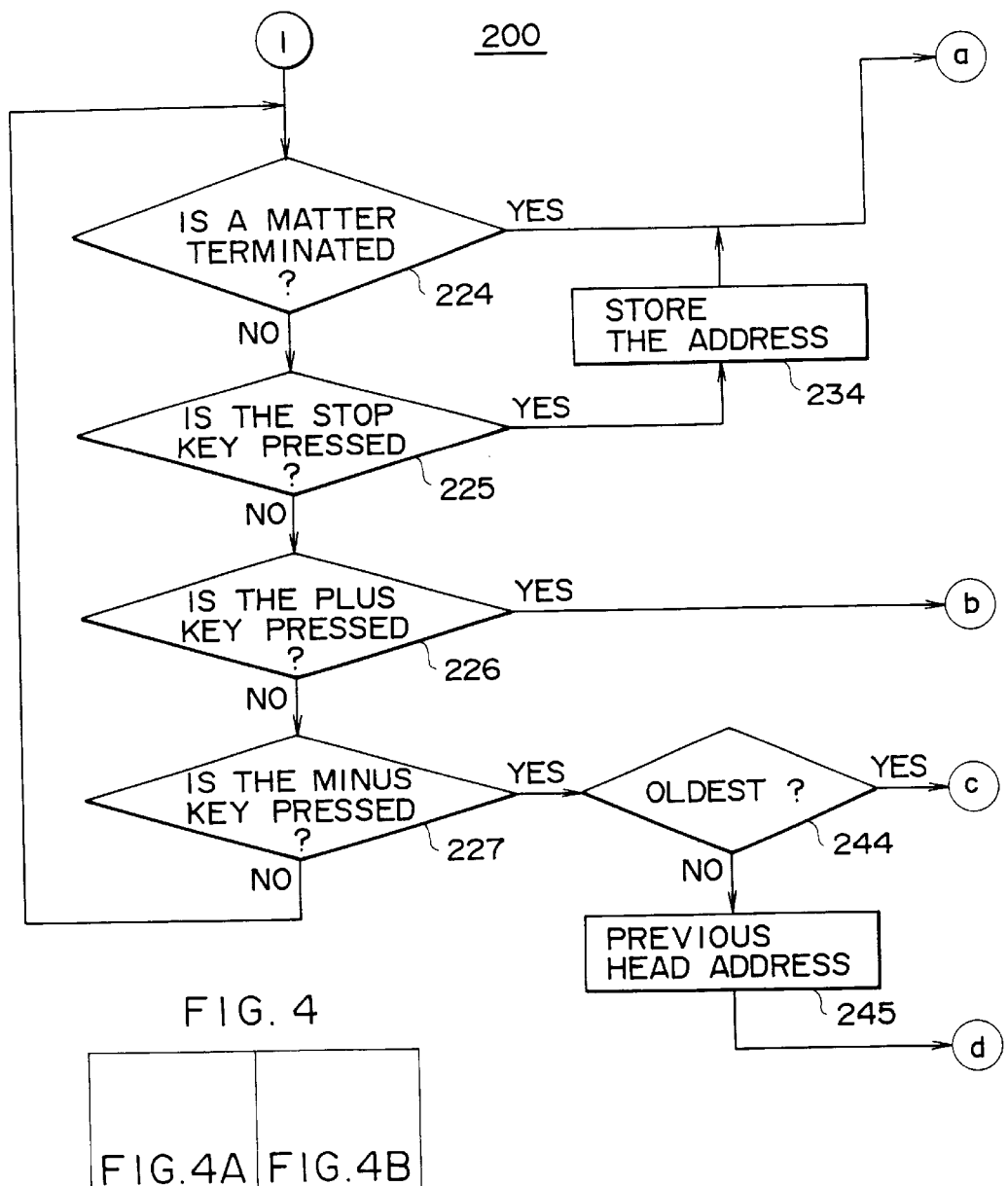
FIG. 4 is a flowchart showing the embodiment continued from FIG. 3.
Figure 4B:
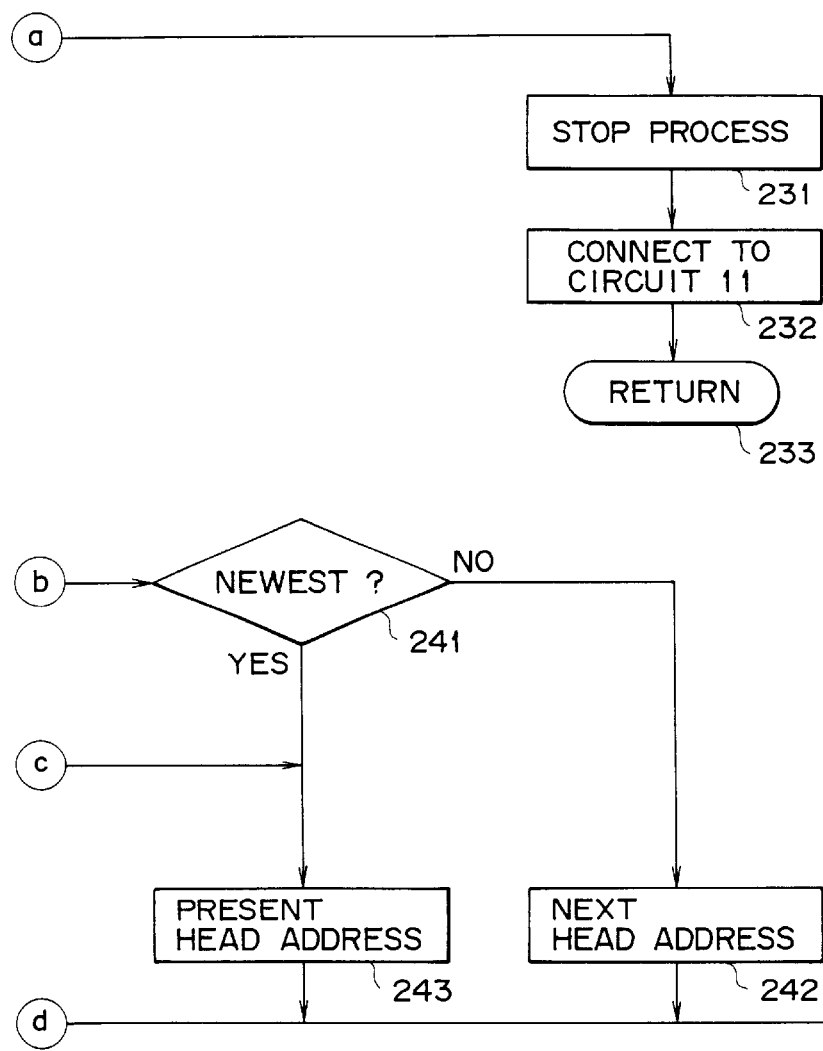

The ROM 42 is, as a part of a program written therein, provided with, for example, a recording routine 100 shown in FIG. 2 and a reproducing routine 200 shown in FIGS. 3 and 4. In this respect, the details on these routines 100 and 200 will be described later.

Further, since the physical address of the memory 22 is not ring-shaped, the address of the memory 22 is made ring-shaped by the use of the program for the ROM 42. More specifically, when the writing or reading reaches the last address of the memory 22 on recording or on reproducing, data EOM indicating this is outputted from the control circuit 24, and therefore, the microcomputer 40 monitors the presence or absence of this data EOM on recording and on reproducing.

When the data EOM is outputted, a command RECPWR or PLAYWR for standing ready for writing or reading and its start address A ADR are supplied from the microcomputer 40 to the control circuit 24, and subsequently, a permission command RECD or PLAYDD for writing or reading is supplied.

Therefore, when writing or reading is executed up to the last address of the memory 22 on recording or on reproducing, the writing or the reading is continued at an address indicated by the start address A ADR, and the memory 22 becomes ring-shaped.

Furthermore, the ROM 42 is provided with a frequency table for broadcasting stations. More specifically, if this receiver is destined for Japan, the whole of Japan is divided into, 14 regions such as "Hokkaido" to "Kyushu" districts in accordance with the reception status for broadcasting, and in the frequency table, data on frequencies for AM broadcasting stations can be received respectively in each region thus divided. For example, the dividing ratio of PLL is provided for each region.

The microcomputer 40 is connected to a memory 51 outside. For this memory 51, a ROM capable of electrically erasing and writing data is used, or a RAM which is backed up by a battery although not shown is used, in other words, for the memory 51, a nonvolatile memory is used so that any data written can be retained even when the power supply is turned off. Also, as data on reception frequency for station selection, the memory 51 is adapted to store the dividing ratio and the like of PLL variable dividing circuit for the reception circuit 11.

When the recording/reproducing circuit 20 has such standards or specifications as described above, the start address A ADRS for writing and reading (recording and reproducing) of the memory 22 can be designated, but the microcomputer 40 is not capable of knowing an address at the termination of the writing and reading.

For this reason, in this example, the memory 51 is provided with a management table RECT for managing the address for the memory 22 as shown in, for example, FIG. 5. In this management table RECT, the address area for the memory 22 is divided into a plurality of areas, and the divided areas are managed as units. More specifically, the address area for the memory 22 is divided into n pieces of areas X A1 to X An, for example, an area for 1 second at a time, and when the respective head addresses of the divided areas X A1 to X An are assumed to be addresses A ADR1 to A ADRn, the management table RECT has 1 set each of their head addresses A ADR1 to A ADRn, head flags BGN1 to BGNn, and unreproduced flags UPB1 to UPBn corresponding to areas X A1 to X An.

In this case, if it is assumed that a matter has been recorded in, for example, divided areas X A2 to X A5, the divided area X A2 becomes a first area used for the recording, and therefore, a head flag BGN2 corresponding to this area X A2 is set to "1" while head flags BGN3 to BGN5 corresponding to other areas X A3 to X A5 respectively are caused to be "0". Namely, when a certain matter is recorded in the memory 22, a head flag BGNk corresponding to the first divided area X Ak (k=any of 1 to n) used for recording the matter is set to "1", and head flags corresponding to other divided areas used for the recording are caused to be "0".

Therefore, by checking the head flags BGN1 to BGNn, it can be seen whether or not a divided area corresponding thereto is the first divided area used for recording the matter. Each divided area X A1 to X An is classified by head addresses A ADR1 to A ADRn.

Unreproduced flags UPB1 to UPBn show whether or not their corresponding divided areas X A1 to X An are unreproduced ones, and if a certain divided area has never been used for reproducing after recorded, the corresponding unreproduced flag UPNk is "1", and if it has been used even once for reproducing, the corresponding unreproduced flag UPBk is caused to be "0".

Further, to the microcomputer 40, there are connected a LCD 52 as a display for displaying various information such as a reception frequency, and various operation keys K PW to K PB and, for example, seven station selection keys K1 to K7. In this respect, these operation keys K PW to K PB and station selection keys K1 to K7 are all constituted by non-lock type push switches.

In such structure, when the CPU 41 executes a program of the ROM 42, the respective processes and operations are executed as below.

[On/Off of Power Supply]

As regards the power supply unit, On and Off of the power supply are alternately repeated every time a power key K PW of the operation keys K PW to K PB is pressed. When the power supply is off, the operating voltage is supplied only to the microcomputer 40, which is in a standby state. When the power supply is on, the power supply is supplied to all the circuits, but the recording/reproducing circuit 20 is in the standby state.

[Presetting of Broadcasting Station]

This is a case of presetting a broadcasting station to station-selection keys K1 to K7. In this case, an area key K AE of the operation keys K PW to K PB is pressed when the power supply for the receiver is on.

Every time the area key K AE is pressed, the region names obtained when the whole of Japan was divided into 14 regions are displayed on the LCD 52 in turn, and data on frequencies of those broadcasting stations can be received in the region displayed. In this case, the dividing ratio is read from the frequency table for broadcasting stations which the ROM 42 has and the dividing ratio thus read is written in the respective areas of the data table of the memory 51.

Therefore, by only selecting the name of a region including a place where the receiver is used, those broadcasting stations which can be received in the region are to be preset to any of the station-selection keys K1 to K7.

[Station Selection by a Station-Selection Key]

This shows a case where broadcasting stations preset to the station-selection keys K1 to K7 are selected. In this case, of the station-selection keys K1 to K7, any station-selection key Ki (i=any of 1 to 7) is pressed when the power supply for the receiver is on.

Then, of the data table for the memory 51, from an area corresponding to a station-selection key Ki thus pressed, the dividing ratio written there is read, and this dividing ratio is set to the PLL variable dividing circuit for the reception circuit 11. Accordingly, the reception frequency for the reception circuit 11 becomes a frequency corresponding to the station-selection key Ki pressed, and a broadcasting station preset to the station-selection key Ki is selected.

Therefore, when any of the station-selection keys K1 to K7 is pressed, the broadcasting station preset to the station-selection key Ki can be selected, and it is possible to listen to the broadcasting.

[Manual Station Selection]

This shows a case where the user selects a frequency by a keying operation to select a station. In this case, a plus key K+ or a minus key K− of the operation keys K PW to K PB is pressed when the power supply for the receiver is on.

Then, the dividing ratio for the PLL variable dividing circuit of the reception circuit 11 is incremented or decremented, for example, by 1 every time the plus key K+ or the minus key K− is pressed, and as a result, the reception frequency is raised or decreased by 9 kHz each time. The reception frequency at the time is displayed on the LCD 52. Thus, when a desired reception frequency is reached, the reception state of the reception frequency will continue thereafter if the operation of the plus key K+ or the minus key K− is stopped.

Accordingly, by pressing the key K+ or K−, the station can be selected at any reception frequency.

[Recording of voice by Microphone]

This shows a case where voice on a matter or the like is recorded using the microphone 12. In this case, a recording key K RE of the operation keys K PW to K PB is pressed when the power supply for the receiver is off.

Then, the process of the CPU 41 starts from Step 101 in the routine 100 of FIG. 2, it is distinguished in Step 102 whether or not the receiver power supply is on, and since it is off in this case, the process proceeds from the Step 102 to Step 103. In this Step 103, a switching circuit 13 is connected to the microphone 12 side as shown in the figure, and thereafter, the process proceeds to Step 111.

In this Step 111, it is distinguished by checking the table RECT whether or not there is any area in the memory 22 which can be used for recording. If there is the area, the process proceeds from Step 111 to Step 121. In the Step 121, by referring to the table RECT, a head address A ADRk (k=any of 1 to n) of the next area to an area having a newest, unreproduced matter recorded therein within the memory 22, is acquired like the head address of the remainder in the case of FIG. 6A. In this respect, if there is no unreproduced matter, the head address of an area having, for example, an oldest, reproduced matter recorded therein will be acquired.

Further, in the Step 121, by checking the table RECT, a number of divided areas usable for recording are converted to the period of time during which recording can be performed, and this period is once retained in the RAM 43.

Subsequently, in Step 122, the control circuit 24 is instructed to record from the start address A ADRk acquired in the Step 121, and the recording is started. More specifically, a command POWERUP for turning on the power supply is first supplied to the control circuit 24 to cause the recording/reproducing circuit 20 to be in an activated state from the standby state. Next, a command RECPWR to stand ready for recording and the start address A ADRk acquired in the Step 121 are supplied, and the recording/reproducing circuit 20 is caused to be in a standby state for recording from the address A ADRk of the memory 22. Thereafter, a command RECD to execute the recording is supplied. Therefore, the recording/reproducing circuit 20 starts recording from the address A ADRk of the memory 22.

When you talk a matter or the like toward the microphone 21 at this time, an audio signal from the microphone 21 is supplied to the memory 22 through the switching circuit 13 and a low-pass filter 21, so that it is written from the address A ADRk one sample at a time in order, in other words, recorded.

During this period of time, the process in the CPU 41 proceeds to Step 123 to compare, for example, the recordable time retained in the RAM 43 by the Step 121 with time elapsed since recording by the Step 122 was started, whereby it is distinguished whether or not there is still any divided area usable for recording in the memory 22.

If there is a divided area usable for recording in the memory 22, the process proceeds from the Step 123 to Step 124, and in this Step 124, it is distinguished whether or not a reproduction/stop key K PB of the operation keys K PW to K PB has been pressed. If not, the process returns to the Step 123 from the Step 124.

Therefore, when recording is started by the Step 122, the Steps 123 and 124 are repeated thereafter, and if the memory 22 has a divided area usable for recording and the reproduction/stop key K PB has not been pressed, the recording will be continued. In this respect, the address of the memory 22 is used in a ring shape during this recording.

When the divided area usable for recording is exhausted during this recording, this is distinguished by the Step 123, and the process proceeds from the Step 123 to Step 131. When the reproduction/stop key K PB is pressed during the recording, this is distinguished by the Step 124, and the process proceeds from the Step 124 to the Step 131.

In the Step 131, the termination process for recording is executed. More specifically, a command STOP to stop the recording/reproducing operation is supplied to the control circuit 24, and then a command STOPPWRD to turn off the power supply is supplied. Accordingly, the recording/reproducing circuit 20 enters a standby state.

Further, in the Step 131, the head flag and the unreproduced flags of the table RECT are updated in accordance with use results of the divided area. Of the divided areas used for recording at this time, the head address A ADRk of the first area is stored in the memory 51 as the head address of the area having a newest, unreproduced matter recorded therein.

Thereafter, the Step 132 terminates the routine 100 to enter a standby state for the next process.

In this respect, in the Step 111, if the memory 22 has no area usable for recording, the process proceeds from the Step 111 to Step 112. In the Step 112, a formation circuit 19 is driven to form a signal for error noise, and this signal is supplied to an amplifier 15. From a speaker 16, a beeping sound is produced as a warning notifying that there is no memory area in which recording can be performed. Thereafter, the process proceeds to Step 132 to complete the routine 100.

When the receiver power supply is off, pressing the recording key K RE causes a new matter to be recorded in an area contiguous to an area having a newest, unreproduced matter reported therein within the memory 22. When a free area is exhausted in the memory 22, or when the reproduction/stop key K PB is pressed, the recording is terminated.

[Recording of Broadcast]

This is a case where a broadcast received by the reception circuit 11 is recorded. In this case, the recording key K RE is pressed when the receiver power supply is on.

Then, the process of the CPU 41 starts from the Step 101 of the routine 100, and it is distinguished in the Step 102 whether or not the receiver power supply is on. In this case, since the power supply is on, the process proceeds from the Step 102 to Step 104, and in this Step 104, the switching circuit 13 is connected to the reception circuit 11 side contrary to the figure, and thereafter, the process proceeds to the Step 111.

Accordingly, thereafter, the broadcast is recorded as described in the above-described [voice recording operator].

[Reproduction of Voice]

This is a case where a matter or broadcast recorded in accordance with the above-described [Recording of Voice] is reproduced. In this case, the reproduction/stop key K PB is pressed whether the reciever power supply is on or off.

Then, the process in the CPU 41 starts from the Step 201 of the routine 200 in FIG. 3, and in the Step 202, the switching circuit 14 is connected to the recording/reproducing circuit 20 side contrary to the figure, and thereafter, the process proceeds to Step 211.

In this Step 211, it is distinguished by checking the table RECT whether or not there is any unreproduced matter, and if there is, the process will proceed from the Step 211 to the Step 221. In this Step 221, by referring to the table RECT, the head address A ADRk of the oldest area is acquired from areas having unreproduced matters recorded therein within the memory 22, like the head address of the area ③ in the case of FIG. 6A.

Subsequently, in Step 222, the control circuit 24 is instructed to reproduce from the start address A ADRk acquired in the Step 221, and the reproducing is started. More specifically, a command POWERUP to turn on the power supply is first supplied to the control circuit 24 to cause the recording/reproducing circuit 20 to be in an activated state from the standby state. Next, a command PLAYPWR to stand ready for reproducing and the start address A ADRk acquired in the Step 122 are supplied, and the control circuit 24 is caused to be in a standby state for reproducing from the address A ADRk of the memory 22. Thereafter, a command PLAYDD to execute the reproducing is supplied. Accordingly, in the recording/reproducing circuit 20, the reproducing is started from the address A ADRk of the memory 22.

When reproducing from the memory 22 is started, the audio signal is supplied to the speaker 16 through a signal line of a low-pass filter 23, the switching circuit 14 and the amplifier 15. Accordingly, reproducing of the oldest, unreproduced matter is to be started within the memory 22.

During this period of time, the process in the CPU 41 proceeds to Step 223, and in this Step 223, for example, waiting for 1 second is executed, and thereafter, the matter under the reproducing is regarded as "reproduced".

Subsequently, the process proceeds to Step 224 in FIG. 4, and in this Step 224, it is distinguished from the control circuit 24 whether or not data EOM indicating that reproducing advanced up to the last address of the matter currently under reproducing has been outputted. If the data EOM has not been outputted, the matter currently under reproducing is continuously being reproduced, and therefore, the process proceeds from the Step 224 to Step 225. In this Step 225, it is distinguished whether or not the reproduction/stop key K PB has been pressed.

When the reproduction/stop key K PB has not been pressed, the process proceeds from the Step 225 to Step 226, and in this Step 226, it is distinguished whether or not the plus key K+ has been pressed. If it has not been pressed, the process proceeds from the Step 226 to Step 227, and in this Step 227, it is distinguished whether or not the minus key K− has been pressed. If it has not been pressed, the process returns from the Step 227 to the Step 224.

When reproducing of the matter is started by the Step 222, the reproduced state of the matter is continued, and the processes in the Steps 224 to 227 will be repeated until the reproducing is terminated.

When the reproducing of the matter currently under reproducing advances up to the last address, the data EOM indicating this advancement is outputted from the control circuit 24, and this data EOM is detected by Step 224. The process proceeds from the Step 224 to Step 231, and in this Step 231, a termination process for reproducing is executed. More specifically, to the control circuit 24, a command STOP to stop the operation of recording/reproducing is supplied, and then a command STOPPWRD to turn off the power supply is supplied. Accordingly, the recording/reproducing circuit 20 enters a standby state. An unreproduced flag corresponding to the divided area used for the reproducing is set to "0".

Subsequently, the process proceeds to Step 232, and the switching circuit 14 is connected to the reception circuit 14 side to terminate the routine 200 by Step 233 thereafter. When the reproduction/stop key K PB is pressed, the oldest, unreproduced matter is reproduced, and when the reproducing of the matter is terminated, the process returns to the state before this reproducing is executed.

When the reproduction/stop key K PB is pressed while the matter is being reproduced and the Steps 224 to 227 are repeated, this is detected in the Step 225, and the process proceeds from the Step 225 to Step 234. In the Step 234, a period of time since the reproducing was started by the Step 222 is converted into an address in the memory 22, and this address is retained in the memory 51. Thereafter, the process proceeds to the Step 231 to terminate the routine 200 by the Step 233. Accordingly, if reproducing is started from the address retained in the memory 22, even if the reproducing is suspended midway, it will be possible to listen to the follow-up.

Further, when the plus key K+ is pressed while the matter is being reproduced and the Steps 224 to 227 are repeated, this is detected in Step 226, and the process proceeds from the Step 226 to Step 241.

In the Step 241, it is distinguished by checking the table RECT whether or not the matter currently under reproducing is the newest one, and if it is not the newest matter, the process proceeds from the Step 241 to Step 242 because there is a matter recorded next. In the Step 242, by checking the table RECT, the head address of the next matter is fetched, this is set to the start address A ADRk, and thereafter, the process returns to Step 222.

Therefore, since reproducing is started from the head address acquired in the Step 242 thereafter, when the plus key K+ is pressed while a certain matter is being reproduced, it becomes possible to reproduce the next matter to the matter under reproducing from the beginning.

In this respect, in the Step 241, if the matter currently under reproducing is a newest matter, the process proceeds from the Step 241 to Step 243 because there is no matter recorded next. In this Step 243, by checking the table RECT, the head address of the matter currently under reproducing is fetched, this is set to the start address A ADRk, and thereafter, the process returns to the Step 222. Accordingly, when the plus key K+ is pressed while the newest matter is being reproduced, it is possible to listen to the newest matter from the head again.

Further, when the minus key K− is pressed while the matter is being reproduced and the Steps 224 to 227 are repeated, this is detected in the Step 227, and the process proceeds from the Step 227 to the Step 244.

In the Step 244, by checking the table RECT, it is distinguished whether or not the matter currently under reproducing is the oldest matter, and if it is not the oldest matter, the process proceeds from the Step 244 to the Step 245 because there is a matter recorded before it. In the Step 245, by checking the table RECT, the head address of the previous matter is fetched, this is set to the start address A ADRk, and thereafter, the process returns to the Step 222.

Accordingly, since reproducing is started from the head address acquired in the Step 245 thereafter, when the minus key K– is pressed while a certain matter is being reproduced, a matter previous to the matter under reproducing can be reproduced from the beginning.

In this respect, in the Step 244, if the matter currently under reproducing is the oldest one, the process proceeds from the Step 244 to the Step 243 because there is no matter recorded before it, the head address of the matter currently under reproducing is set to the start address A ADRk, and thereafter, the process returns to the Step 222. Accordingly, when the minus key K– is pressed while the oldest matter is being reproduced, it is possible to listen to the oldest matter from the head again.

Further, in the Step 211, if there is no unreproduced matter, the process proceeds from the Step 211 to the Step 212. In this Step 212, the address retained by the Step 234 is fetched from the memory 51, this is set to the start address A ADRk, and thereafter, the process proceeds to the Step 222. Therefore, the matter whose reproducing was suspended last time will be able to be reproduced from the portion at which the reproducing was suspended.

[Summary]

As described above, according to the receiver of FIG. 1, a matter can be recorded and reproduced using the memory 22, and in this case, particularly according to the above-described receiver, overwrite recording on an unreproduced matter is prohibited and reproducing is arranged to be started from an unreproduced matter in accordance with the idea that the user listens to, at least once, a matter once recorded. Therefore, the user can surely listen to the matter once recorded only by pressing the reproduction/stop key K PB.

As regards a matter once reproduced after recording, overwrite recording thereon is allowed, and since the address of the memory 22 is made ring-shaped, recording can be performed by making full use of the area for the memory 22 even if any unnecessary recording is not erased.

Further, since it is not necessary to manage by assigning a number to each matter recorded among others, it is possible to perform recording and reproducing only by the use of the recording key K RE and the reproduction/stop key K PB, and the operation is very simple and easy.

In this respect, in the foregoing, the address management method for the memory 22 can be changed in accordance with the standards or specifications of the memory 22 and the control circuit 24. For example, even in the case of the above-described memory 22 and control circuit 24, it is also possible to store the start address and termination address in the memory 51 for each matter recorded for management, and in this case, since when the recording is terminated, this is indicated by the data EOM, the period of time used for the recording can be converted into a termination address for writing.

According to the present invention, the user can certainly listen to any matter once recorded only by a keying operation for reproducing even if the matter is not selected. Also, it is possible to make full use of the memory area for recording even if any unnecessary recording is not erased. Further, it is possible to perform recording and reproducing only by a keying operation for recording and reproducing, and the operation is very simple and easy.

What is claimed is:

1. A recording/reproducing apparatus, comprising:

a first IC memory wherein operations for writing/reading of an audio signal are performed;

a control circuit for controlling said writing/reading of said audio signal to/from respective addresses within said first IC memory, wherein said addresses are arranged in a ring shape;

system controlling means for automatically writing, when a recording key thereof is pressed by a user of the apparatus, a first audio signal starting at an address succeeding an area within said first IC memory wherein a newest and unread audio signal has been stored, and for automatically reading, when a reproduction key is pressed by the user, a second audio signal from a head address of a predetermined area wherein an oldest and unread audio signal has been stored within said first IC memory, wherein a nonvolatile memory is included in said first IC memory to preserve said audio signal written therein, and said system controlling means stops said reading of said second audio signal when said reading of said second audio signal from said predetermined area within said first IC memory is completed, and said system controlling means sets said predetermined area to a read area; and a second IC memory for storing a management table for managing said memory addresses within said first IC memory at respective divided areas, wherein said management table includes for each of said respective divided areas a head address of said divided area, a head flag for indicating that said divided area is a first area for said writing of said audio signal, and an unreproduced flag for indicating whether said divided area has been reproduced.

* * * * *